(12) United States Patent
Perminjat et al.

(10) Patent No.: US 12,721,160 B2
(45) Date of Patent: Aug. 25, 2026

(54) THERMALLY ENHANCED FLIP CHIP BALL GRID ARRAY PACKAGE WITH IMPROVED HEAT DISSIPATION

(71) Applicant: STMicroelectronics International N.V., Geneva (CH)

(72) Inventors: Florian Perminjat, Saint Romans (FR); Fabrice De Moro, Saint Verand (FR)

(73) Assignee: STMicroelectronics International N.V., Geneva (CH)

( * ) Notice: Subject to any disclaimer, the term of this patent is extended or adjusted under 35 U.S.C. 154(b) by 402 days.

(21) Appl. No.: 18/375,716

(22) Filed: Oct. 2, 2023

(65) Prior Publication Data

US 2025/0112110 A1 Apr. 3, 2025

(51) Int. Cl.
*H10W 40/22* (2026.01)
*H10W 40/60* (2026.01)
(Continued)

(52) U.S. Cl.
CPC ........... *H10W 40/22* (2026.01); *H10W 40/60* (2026.01); *H10W 74/01* (2026.01);
(Continued)

(58) Field of Classification Search
CPC . H01L 23/3675; H01L 21/56; H01L 23/3128; H01L 23/3135; H01L 23/40; H01L 24/16; H01L 24/32; H01L 24/33; H01L 24/73; H01L 2224/16227; H01L 2224/32225; H01L 2224/32245; H01L 2224/33181; H01L 2224/73204; H01L 2224/73253; H10W 40/22; H10W 40/60; H10W 74/01; H10W 74/117;
(Continued)

(56) References Cited

U.S. PATENT DOCUMENTS 9,355,985 B2 * 5/2016 Vincent ................. H01L 25/105
9,698,132 B1 * 7/2017 Ady .................... H01L 23/3736
(Continued)

OTHER PUBLICATIONS

Radian Thermal Products, Inc.: "EZ Snap Clip for BGA Heatskins—Radian Thermal," 2023, 10 pgs.
(Continued)

*Primary Examiner* — Christine S. Kim
*Assistant Examiner* — Nathalie R Fayette
(74) *Attorney, Agent, or Firm* — Crowe & Dunlevy LLC

(57) ABSTRACT

An integrated circuit package includes a support substrate with front connection pads on a front surface thereof and rear connection pads on a rear surface thereof. An integrated circuit device is mounted to the support substrate in flip chip orientation with a front face of the integrated circuit device facing the front surface of the support substrate. A thermally conductive heat spreader is mounted adjacent a rear face of the integrated circuit device. External direct thermal paths thermally couple a top surface of the thermally conductive heat spreader to the rear surface of the support substrate. Each external direct thermal path includes a first portion on and in direct contact with thermally conductive heat spreader, a second portion on and in direct contact with an external side surface of the support substrate and a third portion on and in direct contact with the rear surface of the support substrate.

9 Claims, 2 Drawing Sheets

(51) Int. Cl.
*H10W 72/00* (2026.01)
*H10W 72/30* (2026.01)
*H10W 74/01* (2026.01)
*H10W 74/10* (2026.01)
*H10W 74/15* (2026.01)
*H10W 90/00* (2026.01)

(52) U.S. Cl.
CPC ........ *H10W 74/117* (2026.01); *H10W 74/121* (2026.01); *H10W 72/07354* (2026.01); *H10W 72/347* (2026.01); *H10W 72/877* (2026.01); *H10W 74/15* (2026.01); *H10W 90/724* (2026.01); *H10W 90/734* (2026.01); *H10W 90/736* (2026.01)

(58) Field of Classification Search
CPC ......... H10W 74/121; H10W 72/07354; H10W 72/347; H10W 72/877; H10W 74/15; H10W 90/724; H10W 90/734; H10W 90/736
See application file for complete search history.

(56) References Cited

U.S. PATENT DOCUMENTS

| | | | | |
|---|---|---|---|---|
| 2014/0015106 | A1 | 1/2014 | Hsieh et al. | |
| 2016/0049349 | A1 | 2/2016 | Lane et al. | |
| 2018/0358280 | A1* | 12/2018 | Gandhi | H01L 24/29 |
| 2020/0051888 | A1* | 2/2020 | Lin | H01L 23/28 |
| 2020/0098666 | A1 | 3/2020 | Wan et al. | |
| 2022/0037229 | A1* | 2/2022 | Chen | H01L 23/3675 |
| 2022/0310474 | A1* | 9/2022 | Yeh | H01L 24/33 |
| 2023/0119181 | A1* | 4/2023 | Kim | H01L 23/49833 257/659 |
| 2023/0411173 | A1* | 12/2023 | Kuo | H01L 23/5383 |
| 2025/0105085 | A1* | 3/2025 | Nasr | H01L 24/16 |

OTHER PUBLICATIONS

NXP: "AN13656, Assembly Guidelines for Flip Chip Plastic Ball Grid Array and Chip Scale Package," Rev. 1—Sep. 1, 2022, Application Note, 38 pgs.

* cited by examiner 300
202t
140
120
142
202t
202
336
122
130
202s
104
126
128
132
202
202s
202b
212
208
108
106
112
110
202b 400
440a
120
142
440
126
128
440b
122
202t
440c
132
202t
130
202s
104
202
202
202s
202b
212
208
108
106
112
110
202b 500
202t
540a
120
142
540
126
128
202t
122
540b
202
130
132
202s
104
202
202s
202b
212
208
108
106
112
110
202b

THERMALLY ENHANCED FLIP CHIP BALL GRID ARRAY PACKAGE WITH IMPROVED HEAT DISSIPATION

TECHNICAL FIELD

The present disclosure generally relates to integrated circuit packaging technology and, in particular, to an improved heat dissipation for a thermally enhanced flip chip ball grid array (TEFCBGA) package.

BACKGROUND

Heat dissipation with respect to integrated circuit packages is a critical consideration for package design. The use of heat sinks mounted to the package or the incorporation of a heat spreader plate in the package are known solutions. Dissipating heat though the support substrate of the package to which the integrated circuit device is mounted is also a known solution. Notwithstanding the known solutions, and in view of the shrinking in package sizes with scaling of the integrated circuit devices and the use of higher power circuitry, providing effective heat dissipation continues to be a challenge.

There is a need in the art for an improvement in heat dissipation for integrated circuit packages.

SUMMARY

In an embodiment, an integrated circuit package comprises: a support substrate including front connection pads on a front surface of the support substrate and rear connection pads on a rear surface of the support substrate; an integrated circuit device mounted to the support substrate in flip chip orientation with a front face of the integrated circuit device facing the front surface of the support substrate; a thermally conductive heat spreader mounted adjacent a rear face of the integrated circuit device; and a plurality of external direct thermal paths, each external direct thermal path thermally coupling a top surface of the thermally conductive heat spreader to the rear surface of the support substrate.

In an embodiment, a method for packaging an integrated circuit device in a package comprises: mounting the integrated circuit device to a support substrate in flip chip orientation with a front face of the integrated circuit device facing a front surface of the support substrate; mounting a thermally conductive heat spreader adjacent a rear face of the integrated circuit device; and producing a plurality of direct thermal paths on external surfaces of the package, wherein each external direct thermal path thermally couples a top surface of the thermally conductive heat spreader to a rear surface of the support substrate.

BRIEF DESCRIPTION OF THE DRAWINGS

For a better understanding of the embodiments, reference will now be made by way of example only to the accompanying figures in which.

DETAILED DESCRIPTION

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless specified otherwise, it is referred to the orientation of the drawings.

Figure 1:
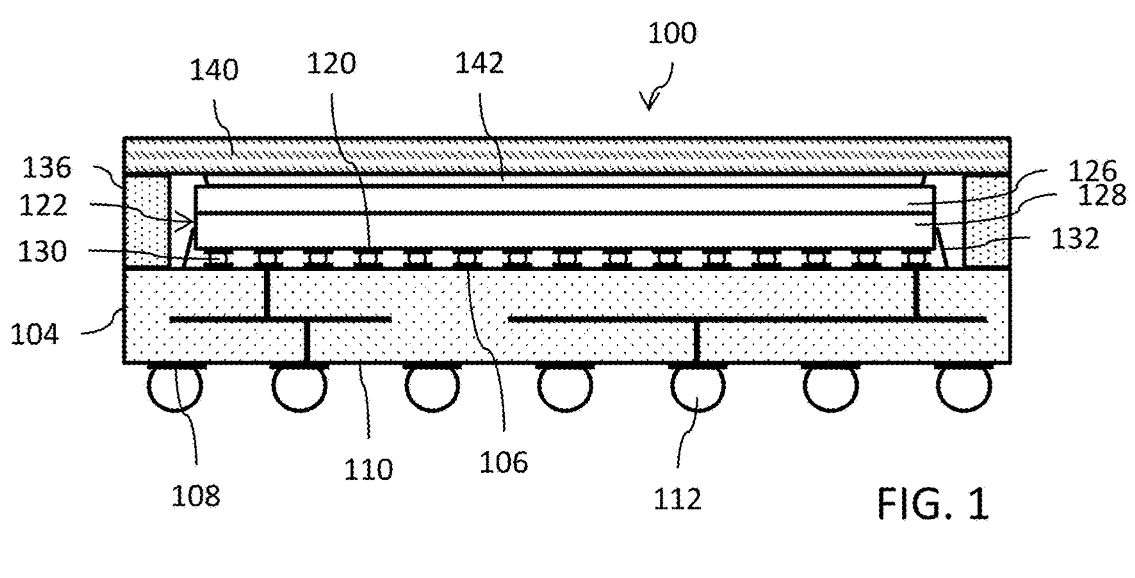
FIG. 1 is a cross-sectional view of a thermally enhanced flip chip ball grid array (TEFCBGA) package.

Reference is made to FIG. 1 which shows a cross-sectional view of a thermally enhanced flip chip ball grid array (TEFCBGA) package 100. The package 100 includes a support substrate 104. The support substrate 104 may, for example, comprise a chip carrier or printed circuit board of an insulating multi-layer design that includes front connection pads 106 on a front surface thereof, rear connection pads 108 on a rear surface thereof and an electrical connection network 110 (formed by lines and vias provided within and between the insulating layers of the support substrate 104) for electrically connecting the front and rear connection pads. The rear connection pads 108 are arranged in an array format with a solder ball 112 at each connection pad 108 to provide a ball grid array (BGA) type connection surface for the package 100. The front connection pads 106 are arranged in a suitable format, which may also comprise an array format, to support making electrical connection to pads 120 of an integrated circuit device 122 that is mounted in flip-chip orientation to the support substrate 104. In this context, "flip-chip" is understood to mean that the front side of the integrated circuit device 122 (such as, for example, an unpackage integrated circuit die) which includes the pads 120 faces the front surface of the support substrate 104 and the opposed back side of the integrated circuit device 122 faces away from the front surface of the support substrate 104.

The integrated circuit device 122 comprises a semiconductor substrate 126 with a front surface supporting (on or in thereof) integrated circuitry such as, for example, transistors. Fabrication of the semiconductor substrate 126 with integrated circuitry is accomplished using front end of line (FEOL) processes well known to those skilled in the art. The integrated circuit device 122 further comprises an interconnect layer 128 supporting multiple metallization levels with metal lines and vias within an insulating material. Fabrication of the interconnect layer 128 is accomplished using back end of line (BEOL) processes well known to those skilled in the art. An upper-most level of the interconnect layer 128 includes the pads 120 of the integrated circuit device 122 with a protecting passivation layer. The interconnect layer 128 may further include, formed from the metal lines, passive electrical circuitry such as inductors and capacitors. The interconnect layer 128 may also include a redistribution layer (RDL) for electrically interconnecting the pads 120 to the metal lines.

The electrical connection of the pads 120 at the front side of the integrated circuit device 122 to the front connection pads 106 of the support substrate 104 is accomplished through an electrically conductive material 130 (for example, a solder material forming a solder bump). An insulating underfill 132 is also provided to fill the space between the electrically conductive material 130 of the solder bumps.

A spacer ring 136 is mounted to the front surface of the support substrate 104 using a suitable adhesive material. The spacer ring 136 is made of an insulating material and surrounds the integrated circuit device 122. A thickness of the spacer ring 136 is sufficient so that an upper surface of the spacer ring 136 is at least as high as the back surface of the semiconductor substrate 126 for the integrated circuit device 122. An external side-peripheral-surface of the spacer ring 136 is aligned (co-planar) with an external side-peripheral-surface of the support substrate 104.

A thermally conductive heat spreader plate 140 is mounted to the upper surface of the spacer ring 136 using a suitable adhesive material. A layer of thermal interface material (TIM) 142 is provided between the bottom surface of the thermally conductive heat spreader plate 140 and the back surface of the semiconductor substrate 126 for the integrated circuit device 122. In the illustrated example, an external side-peripheral-surface of the thermally conductive heat spreader plate 140 is aligned (co-planar) with the external side-peripheral-surface of the spacer ring 136.

Heat removal from the integrated circuit device 122 is accomplished through each of the conduction mode, convection mode and radiation mode via the support substrate 104 (through the solder bumps, interconnect and solder balls) and the thermally conductive heat spreader plate 140 (via the TIM 142). Thus, there are two primary paths for heat dissipation: from the integrated circuit device 122 through solder bumps to the support substrate 104 to air, and from the integrated circuit device 122 through the TIM 142 and the heat spreader plate 140 to air.

Figure 2:
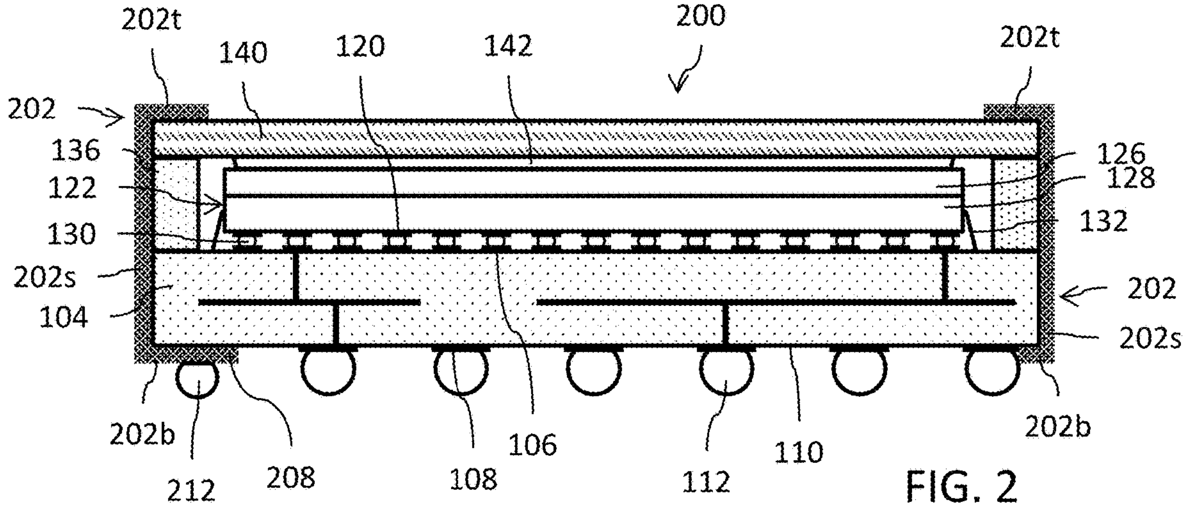
FIG. 2 is a cross-sectional view of an embodiment for TEFCBGA package with improved heat dissipation.
Figure 3:
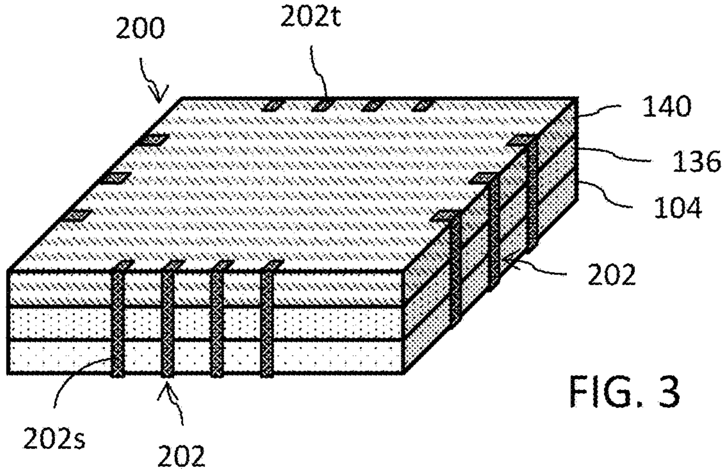
FIG. 3 shows a perspective view of the package shown in FIG. 2.

Reference is made to FIG. 2 which shows a cross-sectional view of a TEFCBGA package 200. A perspective view of the package 200 is shown in FIG. 3. Like references in FIGS. 1, 2 and 3 refer to same or similar components. The package 200 differs from the package 100 in the provision of a plurality of direct thermal paths 202 from the thermally conductive heat spreader plate 140 to the rear surface of the support substrate 104. Each direct thermal path 202 includes a first end at the top surface of the thermally conductive heat spreader plate 140 and a second end at the rear surface of the support substrate 104. The direct thermal path 202 is formed by a first portion **202*t* ("t" for top) on and in direct contact with the top surface of the thermally conductive heat spreader plate 140, a second portion 202*s* ("s" for side) on and in direct contact with an external side surface of the package 200 (including the external side-peripheral-surface of the thermally conductive heat spreader plate 140, the external side-peripheral-surface of the spacer ring 136 and the external side-peripheral-surface of the support substrate 104), and a third portion 202*b* ("b" for bottom) on and in direct contact with the rear surface of the support substrate 104. It will thus be recognized that the direct thermal paths 202 are completely external to the thermally conductive heat spreader plate 140, spacer ring 136 and support substrate 104 of the package 200**.

In one embodiment, shown in detail on the left side of FIG. 2, the third portion **202*b* for each direct thermal path 202 on and in direct contact with the rear surface of the support substrate 104 forms a rear thermal connection pad 208 to which a thermal solder ball 212 is mounted. It will be noted in this implementation that the size of the thermal solder ball 212 may be smaller than the size of the solder ball 112 to account for the difference in thickness between the connection pad 108 on the rear surface of the support substrate 104 and the thickness of the third portion 202*b* of the direct thermal path 202 on the rear surface of the support substrate 104**.

In another embodiment, shown in detail on the right side of FIG. 2, the third portion **202*b* on and in direct contact with the rear surface of the support substrate 104 is in contact with a connection pad 108 on the rear surface of the support substrate 104. It will be noted in this implementation that the connection pad 108 and its solder ball 112 support both electrical connection and thermal coupling. An advantage of this implementation may be to support an electrical grounding of the thermally conductive heat spreader plate 140 through the direct thermal path 202 to the connection pad 108 and its solder ball 112**.

A package 200 may be implemented solely using the embodiment on the left side of FIG. 2, solely using the embodiment on the right side of FIG. 2, or using a combination of the embodiments on the left side and right side of FIG. 2.

Each direct thermal path 202 may, for example, be made of an electrically and thermally conductive material. An example of such a material is copper or silver. The direct thermal path 202 may, for example, be formed by use of a conductive ink or a paste (such as a copper paste) that is printed or deposited onto the external surfaces of the package 200. In particular, the printing or depositing is effectuated on and in direct contact with the top surface of the thermally conductive heat spreader plate 140, on and in direct contact with the external side surface of the package 200 (including the external side surface of the thermally conductive heat spreader plate 140, the external side surface of the spacer ring 136 and the external side surface of the support substrate 104), and on and in direct contact with the rear surface of the support substrate 104. As an example, the direct thermal path 202 may be formed by a local deposition of a conductive material, such as a conductive ink followed by a sintering process. This local deposition may be effectuated using an inkjet printing process. Multiple layers may be used for each direct thermal path 202. Still further, the direct thermal path 202 may be formed by a metal clip (formed using stamping and/or bending) having a C-shape (or U-shape) that is installed over the side of the package 200 and secured by any suitable means including friction and/or the use of an adhesive.

A three-dimensional (3D) printing process used for making the direct thermal path 202 involves depositing the base material used for forming the first portion **202*t*, second portion 202*s* and third portion 202*b* at the same time. This base material may, for example, comprise a copper paste. Prior to deposition of the base material, it is preferred that the surface onto which the base material is deposited be prepared. Surface preparation may, for example, comprise a plasma cleaning. The deposition of the base material (for example, copper paste) may be implemented using an impulse printing process. Impulse printing is a non-contact type of printing (pattern transfer) that is capable of transferring a patch or strip of the base material at a sufficient velocity to allow the patch or strip of base material to be applied to surfaces of and wrap over and around the edges of the structure formed by the thermally conductive heat spreader plate 140, encapsulation block 136 and the support substrate 104. Following deposition of the base material, a drying and/or sintering process is performed to set (or cure) the base material and form the direct thermal path 202**.

The process for 3D printing may also include a step performed after cleaning but before deposition where a non conductive material is applied to surfaces of the thermally conductive heat spreader plate 140, encapsulation block 136 and the support substrate 104 to act as an adhesion improvement material supporting the deposition of the base material and the sticking of the direct thermal path 202 to the package.

In an alternative implementation for 3D printing, separate printing processes may be used to deposit the base material on each exposed surface. For example, and without limitation, a first printing process step is performed to deposit the base material on the third portion 202*b* at the rear surface of the support substrate 104, followed by a second printing process step performed to deposit the base material on either or both the first portion 202*t* at the top surface of the thermally conductive heat spreader plate 140 and the second portion 202*s* at the external side surface of the package 200. Stencil printing may, for example, be used for the first printing process step. Impulse printing may, for example, be used for either or both of the first and the second printing process steps. Laser induced forward transfer or continuous laser assisted deposition may, for example, be used for either or both of the first and second printing process steps. A needle/pipette printing may, for example, be used for either or both of the first and second printing process steps. Inkjet printing may, for example, be used for either or both of the first and second printing process steps. Electrohydrodynamic printing may, for example, be used for either or both of the first and second printing process steps. Jetting may, for example, be used for either or both of the first and second printing process steps.

Figures 4, 5, 6:
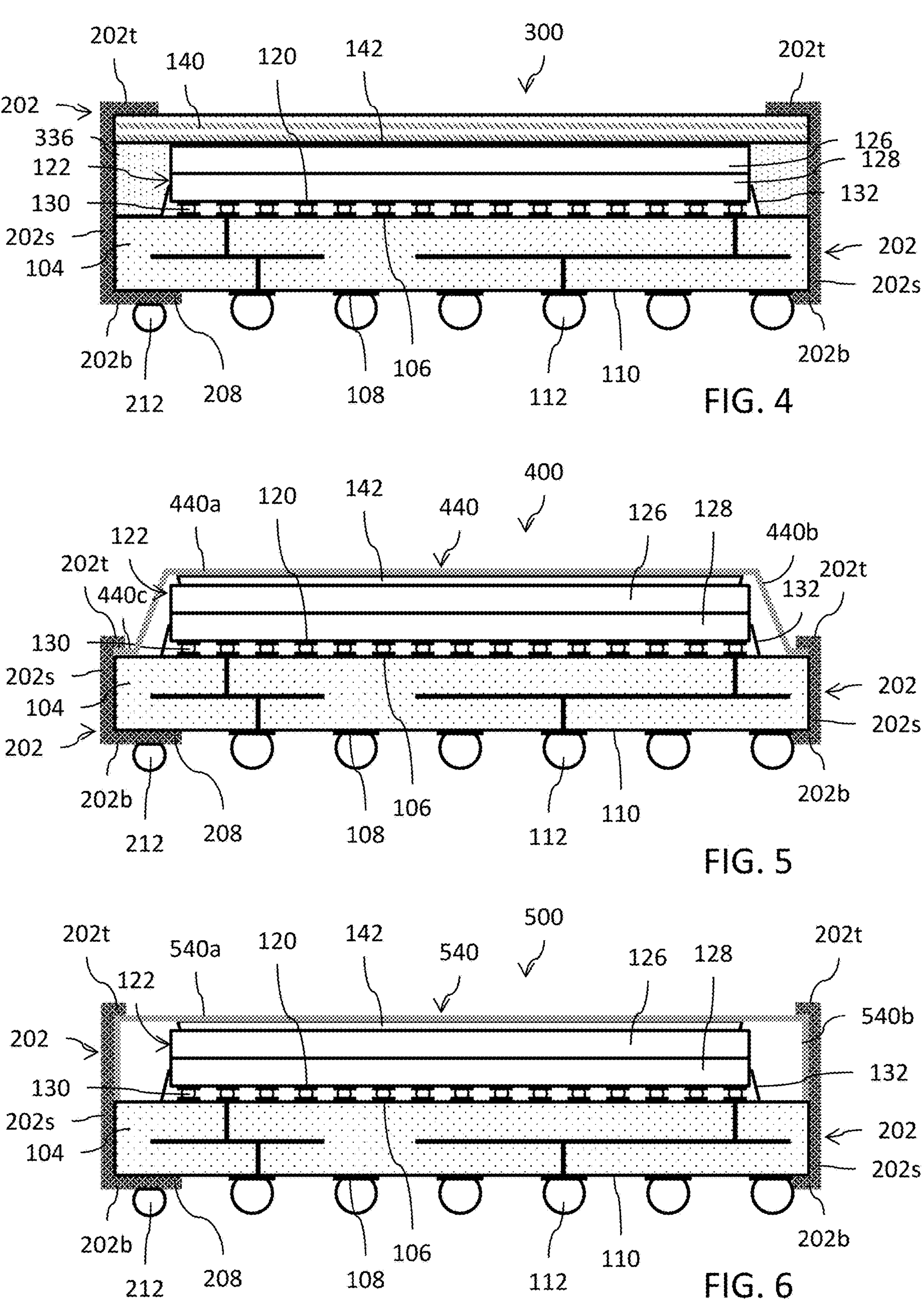
FIG. 4 is a cross-sectional view of an embodiment for TEFCBGA package with improved heat dissipation.
FIG. 5 is a cross-sectional view of an embodiment for a TEFCBGA package with improved heat dissipation.
FIG. 6 is a cross-sectional view of an embodiment for TEFCBGA package with improved heat dissipation.

FIG. 4 shows a cross-sectional view of a TEFCBGA package 300. Like references in FIGS. 2 and 4 refer to same or similar components. The package 300 differs from the package 200 in that the integrated circuit device 122 mounted to the support substrate 104 has been encapsulated in an encapsulation block 336. The spacer ring 136 is omitted. The upper surface of the encapsulation block 336 and the back side of the integrated circuit device 122 are generally coplanar. The thermally conductive heat spreader plate 140 is mounted to the upper surface of the encapsulation block 336 using a suitable adhesive material. A layer of thermal interface material (TIM) 142 is provided between the bottom surface of the thermally conductive heat spreader plate 140 and the back surface of the semiconductor substrate 126 for the integrated circuit device 122.

Each direct thermal path 202 includes a first end at the top surface of the thermally conductive heat spreader plate 140 and a second end at the rear surface of the support substrate 104. The direct thermal path 202 is formed by a first portion 202*t* ("t" for top) on and in direct contact with the top surface of the thermally conductive heat spreader plate 140, a second portion 202*s* ("s" for side) on and in direct contact with an external side surface of the package 200 (including the external side-peripheral-surface of the thermally conductive heat spreader plate 140, the external side-peripheral-surface of the encapsulation block 336 and the external side-peripheral-surface of the support substrate 104), and a third portion 202*b* ("b" for bottom) on and in direct contact with the rear surface of the support substrate 104.

Again, 3D printing of the direct thermal paths 202 may be accomplished in the FIG. 4 implementation using the same techniques as noted above for FIG. 3.

Heat removal from the integrated circuit device 122 is accomplished in FIGS. 3 and 4 through each of the conduction mode, convection mode and radiation mode via the support substrate 104 (through the solder bumps, interconnect and solder balls), the thermally conductive heat spreader plate 140 (via the TIM 142), and through the direct thermal paths 202 between the thermally conductive heat spreader plate 140 and the solder balls 112, 212. Thus, there are four primary paths for heat dissipation: from the integrated circuit device 122 through solder bumps to the support substrate 104 to air; from the integrated circuit device 122 through the TIM 142 and the heat spreader plate 140 to air; from the integrated circuit device 122 through the TIM 142, the heat spreader plate 140 and a portion of each direct thermal path 202 to air; and from the integrated circuit device 122 through the TIM 142, the heat spreader plate 140, the direct thermal path 202 and the support substrate 104 to air.

FIG. 5 shows a cross-sectional view of a TEFCBGA package 400. Like references in FIGS. 2, 4 and 5 refer to same or similar components. The package 400 differs from the packages 200 and 300 in that the spacer ring 136 and encapsulation block 336 are omitted. Also omitted is the thermally conductive heat spreader plate 140. In place of the thermally conductive heat spreader plate 140, a thermally conductive heat spreader lid 440 is used. The thermally conductive heat spreader lid 440 includes a front (ceiling) portion 440*a*, a surrounding wall portion 440*b*, and a peripheral rim portion 440*c*. The peripheral rim portion 440*c* of the thermally conductive heat spreader lid 440 is mounted to the upper surface support substrate 104 using a suitable adhesive material. A layer of thermal interface material (TIM) 142 is provided between the bottom surface of the front portion 440*a* of the thermally conductive heat spreader lid 440 and the back surface of the semiconductor substrate 126 for the integrated circuit device 122. In an example implementation, the surrounding wall portion 440*b* for the thermally conductive heat spreader lid 440 is acutely angled with respect to the upper surface support substrate 104.

Each direct thermal path 202 includes a first end at the top surface of the peripheral rim portion 440*c* of the thermally conductive heat spreader lid 440 and a second end at the rear surface of the support substrate 104. The direct thermal path 202 is formed by a first portion 202*t* ("t" for top) on and in direct contact with the top surface of the peripheral rim portion 440*c* of the thermally conductive heat spreader lid 440, a second portion 202*s* ("s" for side) on and in direct contact with an external side surface of the package 200 (including the external side-peripheral-surface of peripheral rim portion 440*c* of the thermally conductive heat spreader lid 440 and the external side-peripheral-surface of the support substrate 104), and a third portion 202*b* ("b" for bottom) on and in direct contact with the rear surface of the support substrate 104.

Again, 3D printing of the direct thermal paths 202 may be accomplished in the FIG. 5 implementation using the same techniques as noted above for FIG. 3.

FIG. 6 shows a cross-sectional view of a TEFCBGA package 500. Like references in FIGS. 2, 4, 5 and 6 refer to same or similar components. The package 500 differs from the package 400 in the configuration of the thermally conductive heat spreader lid 540. The thermally conductive heat spreader lid 540 includes a front (ceiling) portion 540*a* and a surrounding peripheral wall portion 540*b*. The surrounding wall portion 540*b* for the thermally conductive heat spreader lid 540 is perpendicularly angled with respect to the upper surface support substrate 104. The distal end of the surrounding peripheral wall portion 540*b* of the thermally conductive heat spreader lid 540 is mounted to the upper surface support substrate 104 using a suitable adhesive material. A layer of thermal interface material (TIM) 142 is provided between the bottom surface of the front portion 540*a* of the thermally conductive heat spreader lid 540 and the back surface of the semiconductor substrate 126 for the integrated circuit device 122.

Each direct thermal path 202 includes a first end at the top surface of the front (ceiling) portion 540*a* of the thermally conductive heat spreader lid 540 and a second end at the rear surface of the support substrate 104. The direct thermal path 202 is formed by a first portion 202*t* ("t" for top) on and in direct contact with the top surface of the front (ceiling) portion 540*a* of the thermally conductive heat spreader lid 440, a second portion 202*s* ("s" for side) on and in direct contact with an external side surface of the package 200 (including the external side-peripheral-surface of surrounding peripheral wall portion 540*b* of the thermally conductive heat spreader lid 540 and the external side-peripheral-surface of the support substrate 104), and a third portion 202*b* ("b" for bottom) on and in direct contact with the rear surface of the support substrate 104.

Again, 3D printing of the direct thermal paths 202 may be accomplished in the FIG. 6 implementation using the same techniques as noted above for FIG. 3.

Heat removal from the integrated circuit device 122 in FIGS. 5 and 6 is accomplished through each of the conduction mode, convection mode and radiation mode via the support substrate 104 (through the solder bumps, interconnect and solder balls), the thermally conductive heat spreader lid 440, 540 (via the TIM 142), and through the direct thermal paths 202 between the thermally conductive heat spreader lid 440, 540 and the solder balls 112, 212. Thus, there are four primary paths for heat dissipation: from the integrated circuit device 122 through solder bumps to the support substrate 104 to air; from the integrated circuit device 122 through the TIM 142 and the heat spreader lid 440, 540 to air; from the integrated circuit device 122 through the TIM 142, the heat spreader lid 440, 540 and a portion of each direct thermal path 202 to air; and from the integrated circuit device 122 through the TIM 142, the heat spreader lid 440, 540, the direct thermal path 202 and the support substrate 104 to air.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated circuit package, comprising:

a support substrate including front connection pads on a front surface of the support substrate and rear connection pads on a rear surface of the support substrate;

an integrated circuit device mounted to the support substrate in flip chip orientation with a front face of the integrated circuit device facing the front surface of the support substrate;

a thermally conductive heat spreader mounted adjacent a rear face of the integrated circuit device;

a spacer ring surrounding the integrated circuit device and positioned between a bottom surface of the thermally conductive heat spreader and front surface of the support substrate; and a plurality of external direct thermal paths, each external direct thermal path of said plurality of external direct thermal paths thermally coupling a top surface of the thermally conductive heat spreader to the rear surface of the support substrate;

wherein each external direct thermal path of said plurality of external direct thermal paths comprises: a first portion on and in direct contact with the top surface of the thermally conductive heat spreader; a second portion on and in direct contact with external side surfaces of both the spacer ring and the support substrate; and a third portion on and in direct contact with the rear surface of the support substrate.

2. The integrated circuit package of claim 1, wherein the second portion of each external direct thermal path of said plurality of external direct thermal paths is on and in direct contact with an external side surface of the thermally conductive heat spreader.

3. The integrated circuit package of claim 1, wherein the third portion of at least one external direct thermal path of said plurality of external direct thermal paths is in contact with a corresponding one of the rear connection pads on the rear surface of the support substrate, and further comprising a solder ball mounted to said corresponding one of the rear connection pads.

4. The integrated circuit package of claim 1, wherein the third portion of at least one external direct thermal path of said plurality of external direct thermal paths forms a rear thermal connection pad on the rear surface of the support substrate, and further comprising a solder ball mounted to said rear thermal connection pad.

5. The integrated circuit package of claim 1, wherein the spacer ring is formed by an encapsulation block positioned between the thermally conductive heat spreader and the support substrate, said encapsulation block encapsulating the integrated circuit device, where a bottom surface of the thermally conductive heat spreader is mounted to an upper surface of the encapsulation block.

6. The integrated circuit package of claim 1, wherein the thermally conductive heat spreader comprises a thermally conductive heat spreader plate.

7. The integrated circuit package of claim 1, wherein each external direct thermal path of said plurality of external direct thermal paths is a C-shaped or U-shaped clip.

8. The integrated circuit package of claim 1, wherein each external direct thermal path of said plurality of external direct thermal paths is formed of a printed or deposited conductive ink material.

9. The integrated circuit package of claim 1, wherein each external direct thermal path of said plurality of external direct thermal paths is formed of a printed or deposited conductive paste material.

* * * * *